US009070635B2

(12) United States Patent
Liao et al.

(10) Patent No.: US 9,070,635 B2
(45) Date of Patent: Jun. 30, 2015

(54) REMOVING METHOD

(71) Applicant: United Microelectronics Corp., Hsinchu (TW)

(72) Inventors: Chin-I Liao, Tainan (TW); Yu-Cheng Tung, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/963,688

(22) Filed: Aug. 9, 2013

(65) Prior Publication Data

US 2015/0044879 A1 Feb. 12, 2015

(51) Int. Cl.
*H01L 21/302* (2006.01)
*H01L 21/461* (2006.01)
*H01L 21/311* (2006.01)

(52) U.S. Cl.
CPC ................ *H01L 21/31116* (2013.01)

(58) Field of Classification Search
USPC ........................................... 438/715
See application file for complete search history.

(56) References Cited

U.S. PATENT DOCUMENTS

| 8,435,902 | B2 | 5/2013 | Tang et al. | |
|---|---|---|---|---|
| 2011/0195575 | A1* | 8/2011 | Wang | 438/692 |
| 2011/0230052 | A1 | 9/2011 | Tang et al. | |
| 2012/0196447 | A1 | 8/2012 | Yang et al. | |

* cited by examiner

*Primary Examiner* — Roberts Culbert
(74) *Attorney, Agent, or Firm* — J.C. Patents

(57) ABSTRACT

A removing method including the following steps. A substrate is transferred into an etching machine, wherein the substrate has a material layer formed thereon. A cycle process is performed. The cycle process includes performing an etching process to remove a portion of the material layer, and performing an annealing process to remove a by-product generated by the etching process. The cycle process is repeated at least one time. The substrate is transferred out of the etching machine. In the removing method of the invention, the cycle process is performed multiple times to effectively remove the undesired thickness of the material layer and reduce the loading effect.

15 Claims, 7 Drawing Sheets

REMOVING METHOD

BACKGROUND OF THE INVENTION

1. Field of Invention

The present invention relates to an integrated circuit process, and more particularly to a removing process.

2. Description of Related Art

An etching process is a commonly used method to remove a film layer in a semiconductor process. The etching process generally includes a wet etching and a dry etching. The wet etching provides a higher etching selectivity and is suitable for an isotropic etching process. However, it is difficult to obtain a vertical structure through the wet etching. When more and more devices are developed toward high aspect ratio structures, the dry etching is adopted due to its excellent performance. Besides, the dry etching has the advantages of better control of etching rate, precise etched dimension and high degree of automation etc.

However, with the continued miniaturization of a device size, by-products generated by the dry etching process are easy to remain in small gaps between patterns. Therefore, the undesired thickness of the material layer below the gaps can not be etched completely, and the serious loading effect and other issues occur.

SUMMARY OF THE INVENTION

The present invention provides a removing process, in which a cycle process is performed multiple times to effectively remove the material layer and reduce the loading effect.

The present invention provides a removing method including the following steps. A substrate is transferred into an etching machine, wherein the substrate has a material layer formed thereon. A cycle process is performed. The cycle process includes performing an etching process to remove a portion of the material layer, and performing an annealing process to remove a by-product generated by the etching process. The cycle process is repeated at least one time. The substrate is transferred out of the etching machine.

According to an embodiment of the present invention, the cycle process is repeated at least two times.

According to an embodiment of the present invention, an etching gas of the etching process includes $NF_3$ and $NH_3$, and a volume flow rate ratio of $NF_3$ to $NH_3$ is greater than 1/10 and less than 1/2.

According to an embodiment of the present invention, a radio frequency of the etching process is from 10 kW to 40 kW.

According to an embodiment of the present invention, an etching rate of the etching process is from 0.5 angstrom/second to 1.5 angstrom/second.

According to an embodiment of the present invention, a gas introduced to the annealing process includes $H_2$ and Ar.

According to an embodiment of the present invention, a temperature of the annealing process is from 150° C. to 500.

According to an embodiment of the present invention, the material layer is a silicon oxide layer.

According to an embodiment of the present invention, the silicon oxide layer is a native silicon oxide layer.

According to an embodiment of the present invention, the material layer is located on a fin.

According to an embodiment of the present invention, the material layer is a dielectric layer of a replacement metal gate (RMG) process.

According to an embodiment of the present invention, the removing process is a pre-Epi clean process.

According to an embodiment of the present invention, the removing process is a FinFET STI etching back process.

According to an embodiment of the present invention, the removing method further includes performing a pre-annealing process before the cycle process.

According to an embodiment of the present invention, the cycle process further includes performing at least one purging process before the step of transferring the substrate out of the etching machine.

According to an embodiment of the present invention, the cycle process further includes performing at least one purging process after the annealing process.

According to an embodiment of the present invention, a gas introduced to the at least one purging process includes He.

According to an embodiment of the present invention, a time of the at least one purging process is 10 seconds to 60 seconds.

In view of the above, in the removing process of the invention, a cycle process is performed multiple times to effectively remove the material layer and reduce the loading effect.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
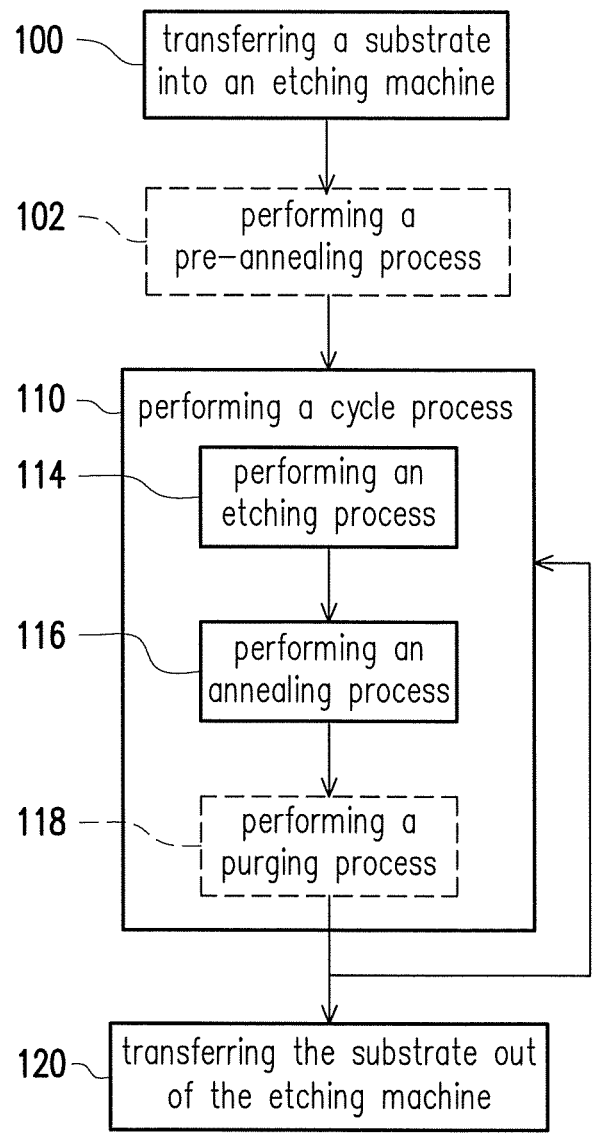
FIG. 1 illustrates a process flow of a removing process according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In the removing process of the invention, a material layer is removed by repeating a cycle process including an etching and an annealing at least one time, and optionally by performing a pre-annealing prior to the cycle process. The cycle process can be performed multiple times to effectively remove the material layer and reduce the loading effect. The embodiments of the invention are described in detail below, but the invention is not limited thereto.

FIG. 1 illustrates a process flow of a removing process according to an embodiment of the present invention. FIG. 2A to FIG. 2E illustrate schematic cross-sectional views of a removing process according to an embodiment of the present invention.

Figure 2A:
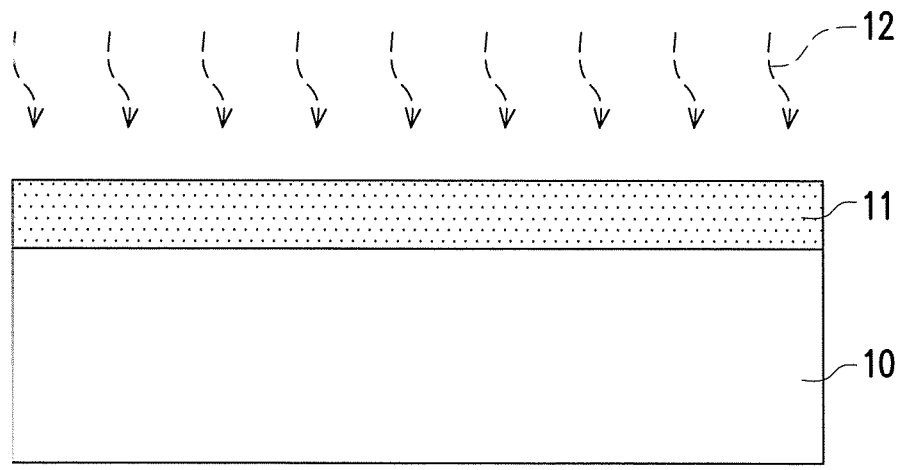
FIG. 2A to FIG. 2E illustrate schematic cross-sectional views of a removing process according to an embodiment of the present invention.

Referring to FIG. 1 and FIG. 2A, in step 100, a substrate 10 is placed on a pedestal and transferred to an etching machine. The substrate 10 has a material layer 11 formed thereon. The material layer 11 can be a silicon oxide layer, silicon nitride layer or silicon oxynitride layer, such as a native silicon oxide layer. The etching machine can be a remote plasma assisted dry etch system.

Referring to FIG. 1 and FIG. 2A, in step 102, a pre-annealing process 12 is optionally performed. The gas introduced to the pre-annealing process 12 includes $H_2$ and Ar. The temperature of the pre-annealing process 12 is more than 90° C., such as from 150° C. to 190° C. The time of the pre-annealing process 12 is from 30 seconds to 120 seconds.

Figure 2B:
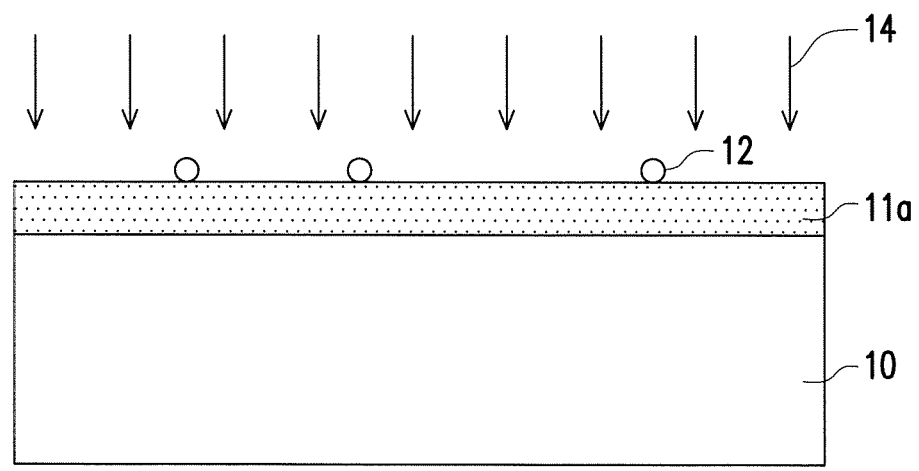
Figure 2C:
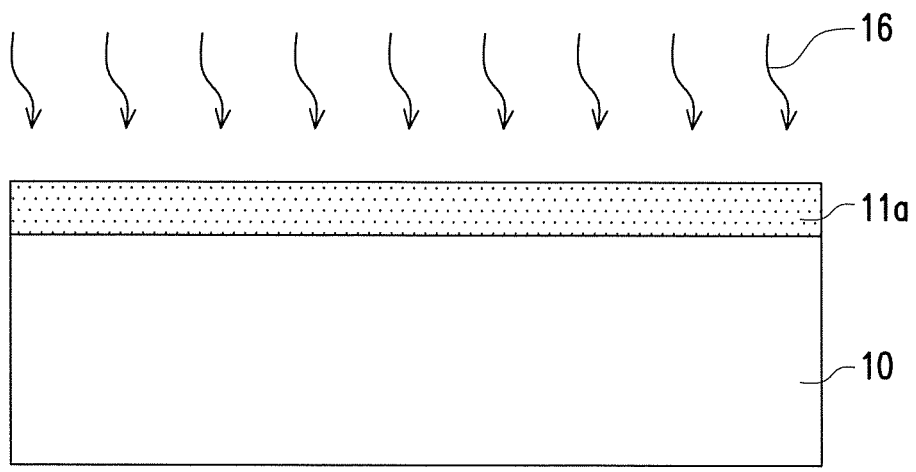

Referring to FIG. 1, FIG. 2B and FIG. 2C, in step 110, a cycle process is performed. The cycle process includes an etching process 14 (step 114) and an annealing process 16 (step 116)

Referring to FIG. 2B, the etching process 14 is performed to remove a portion of the material layer 11, and thus a material layer 11a remains. The etching process 14 can be a plasma etching process. In an embodiment, the etching process 14 includes three steps. The first step of the etching process 14 is a plasma generation step. The gas sources used in the etching process 14 include a fluorine-containing gas source and a hydrogen-containing gas source. The fluorine-containing gas source includes a $NF_3$ source, the hydrogen-containing gas source includes a $NH_3$ source, and a volume flow rate of $NF_3$ is lower than that of $NH_3$. For example, the volume flow rate ratio of $NF_3$ to $NH_3$ ($NF_3/NH_3$) is less than ½, so as to prevent excessive by-products from being generated when the material layer 11 is etched too quickly. In an embodiment, the etching gas used in the etching process 14 includes $NF_3$ and $NH_3$, and the volume flow rate ratio of $NF_3$ to $NH_3$ ($NF_3/NH_3$) is greater than 1/10 and less than ½. $NF_3$ and $NH_3$ are introduced to the etching machine to generate a plasma including $NH_4F$ and $NH_4F \cdot HF$. The reaction scheme (schematic only but not balanced) of the plasma generation step is as follows.

$$NF_3 + NH_3 \rightarrow NH_4F + NH_4F \cdot HF$$

The second step of the etching process 14 is an etching reaction step. The etching reaction is carried out between the plasma and the material layer 11 by controlling the parameters of the etching process 14. In an embodiment, the material layer 11 can be a silicon oxide layer, and the plasma can include $NH_4F$ and/or $NH_4F \cdot HF$. During the etching reaction between the plasma and the material layer 11, the temperature of the pedestal is controlled at 30° C. to 40° C., such as 35° C. The radio frequency of the etching process 14 is from 10 kW to 40 kW. If the radio frequency of the etching process 14 is greater than 40 kW, the etching rate is too fast and therefore excessive by-products 12 such as $(NH_4)_2SiF_{6(solid)}$ are easily generated. If the radio frequency of the etching process 14 is less than 10 kW, the etching rate is too slow and therefore a longer etching time is required and the production capacity is affected. In an embodiment, the etching rate of the etching process 14 is from 0.5 angstrom/second to 1.5 angstrom/second. The reaction scheme (schematic only but not balanced) of the etching reaction step is as follows.

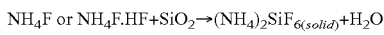
$$NH_4F \text{ or } NH_4F \cdot HF + SiO_2 \rightarrow (NH_4)_2SiF_{6(solid)} + H_2O$$

The third step of the etching process 14 enables the solid by-products 12 (such as $(NH_4)_2SiF_6$) to react and form volatile gases as much as possible by adjusting the temperature of the etching process. In the third step of the etching process 14, the temperature of the etching process 14 can be controlled to be equal to or greater than 100° C. In an embodiment, the temperature of third step of the etching process 14 can be from 150° C. to 190° C., such as 180° C. In an embodiment, the temperature of third step of the etching process 14 can be realized by reducing the distance between the substrate 10 and the heated gas delivery pate in the etching machine. The time of the third step of the etching process 14 can be from 30 seconds to 120 seconds. The reaction scheme (schematic only but not balanced) that solid by-products 12 react to form volatile gases is as follows.

$$(NH_4)_2SiF_{6(solid)} \rightarrow SF_{4(gas)} + NH_{3(gas)} + HF_{(gas)}$$

Referring to FIG. 1 and FIG. 1C, in step 116, the annealing process 16 of the cycle process (step 110) is performed to remove, as much as possible, the residual by-products 12 (such as $(NH_4)_2SiF_6$) or the volatile gases generated from the by-products 12 of the etching process 14. The gas introduced to the annealing process 16 includes a hydrogen-containing gas and an inert gas, such as $H_2$ and Ar. The temperature of the annealing process 16 is equal to or greater than 150° C., such as 150° C. to 500° C. For example, the temperature of the annealing process 16 is 180° C. The time of the annealing process 16 can be from 30 seconds to 120 seconds, such as 60 seconds.

Figure 2D:
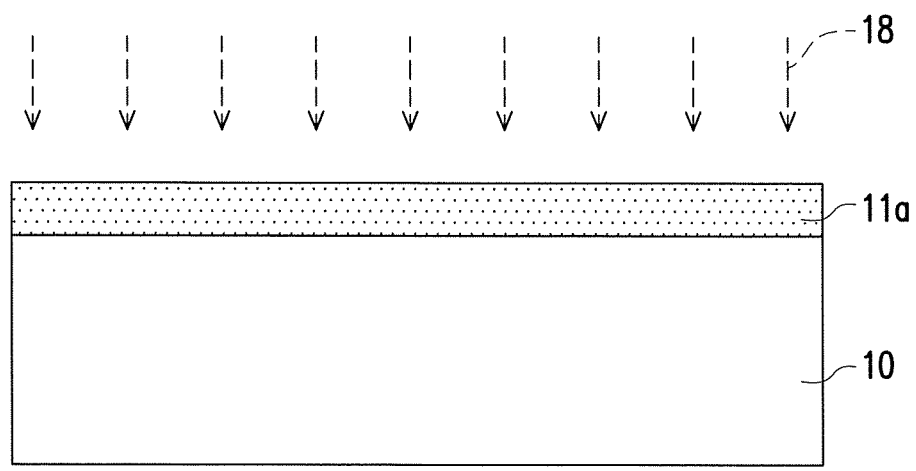

Referring to FIG. 1 and FIG. 2D, in step 118, a purging process 18 can be optionally included in the cycle process (step 110) to remove the residual gases. The gas introduced to the purging process 18 can be an inert gas, such as He with a flow rate of 500 to 2000 sccm. The time of the purging process 18 can be from 10 seconds to 60 seconds. The temperature of the purging process 18 can be from 20° C. to 40° C.

Figure 2E:
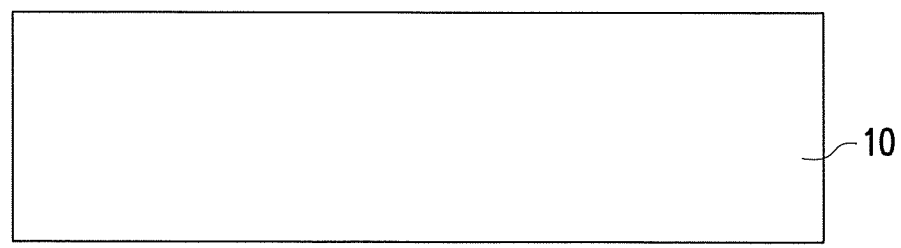

Referring to FIG. 1 and FIG. 2E, the cycle process in step 110 is repeated at least one time. Another portion of the material layer 11 is removed by the repeating of the cycle process in step 110. If the cycle process in step 110 is repeated only two times in the removing process, a first portion of the material layer 11 is removed by one of the two cycle processes and the remaining portion of the material layer 11 is removed by the other of the two cycle processes. If the cycle process in step 110 is repeated three times in the removing process, a first portion of the material layer 11 is removed by one of the three cycle processes, a second portion of the material layer 11 is removed by another of the three cycle processes and the remaining portion of the material layer 11 is removed by the other of the three cycle processes.

The purging process 18 can be optionally included in the cycle process in step 110 upon the actual requirements. In an embodiment, the purging process 18 can be included in each cycle process in step 110. In another embodiment, the purging process 18 can be include in one or several of multiple cycle processes each being the step 110. In an embodiment, the cycle process in step 110 is repeated three or more times in the removing process, and only the middle cycle process(es) include(s) the purging process 18. In another embodiment, the removing process includes multiple cycle processes each being the step 110, and only the last cycle process includes the purging process 18.

Referring to FIG. 1, in step 120, the substrate 10 is transferred out of the etching machine. The removing process is thus completed.

The said embodiments in which the material layer on the substrate is completely removed by the removing process are provided for illustration purposes, and are not construed as limiting the present invention. In another embodiment, only a portion of the material layer is removed and another portion of the material remains on the substrate. Besides, the removing process can be widely applied in the semiconductor process. The undesired thickness of the material layer can be effectively removed whether the material layer is provided with a large area or within small and narrow openings. Therefore, the loading effect can be reduced. Several embodiments are provided below for illustration.

Figure 3A:
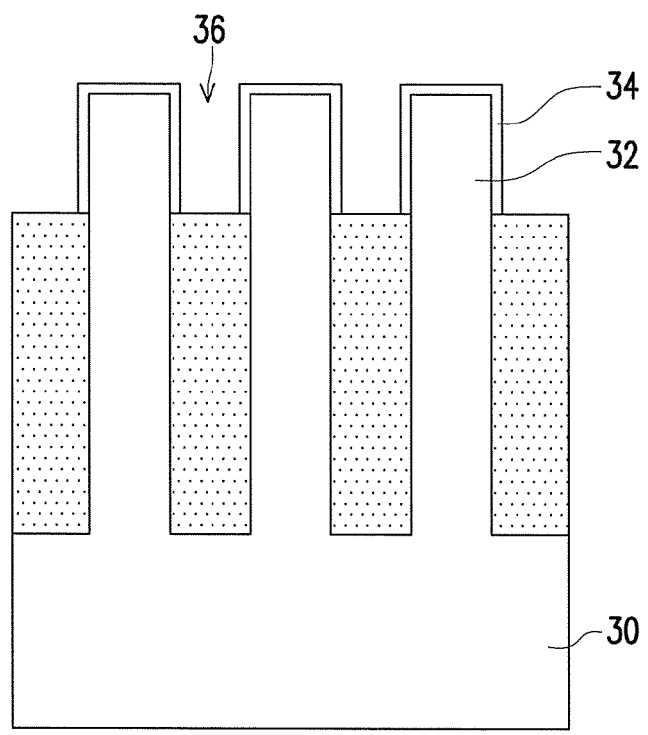
FIG. 3A to FIG. 3B illustrate schematic cross-sectional views of a removing process for removing a dielectric layer of a fin transistor according to an embodiment of the present invention.
Figure 3B:
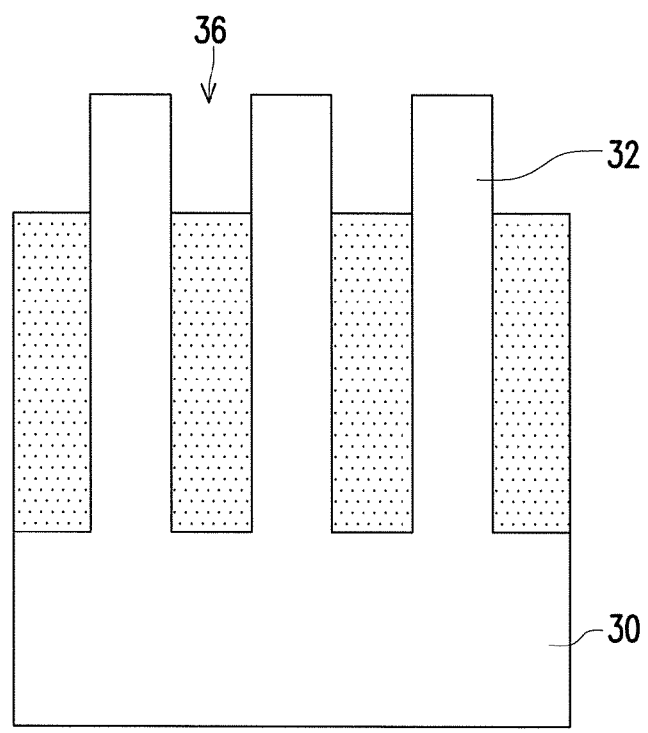

FIG. 3A to FIG. 3B illustrate schematic cross-sectional views of a removing process for removing a dielectric layer of a fin transistor according to an embodiment of the present invention.

Referring to FIG. 3A, FIG. 1 and FIG. 2A, in an embodiment, the material 11 (see FIG. 2B) can be a dielectric layer 34 (see FIG. 3A) formed on multiple fins 32 on a substrate 30. The dielectric layer 34 can be a silicon oxide layer. The gaps 36 between the fins 32 have a very small dimension (such as less than 50 nm), and in such case, the dielectric layer 34 can be removed portion by portion by repeating the cycle process in step 110. Specifically, only a portion of the thickness of the dielectric layer 34 is removed in each cycle process in step 110. By controlling the conditions of the etching process in step 114, the by-products can be controlled to a very small amount. The small amount of the by-products can be removed as much as possible by performing, after each etching process, the annealing process in step 116 and the optional purging process in step 118, so that almost no by-product remains within the small gaps 36 between the fins 32. The remaining portion of the thickness of the dielectric layer 34 is removed by performing another cycle process in step 110, so as to expose a portion of the surfaces of the fins 32, as shown in FIG. 3B. Therefore, the incomplete etching of the dielectric later 34 caused by the by-product residues of the etching process can be avoided.

Figure 4A:
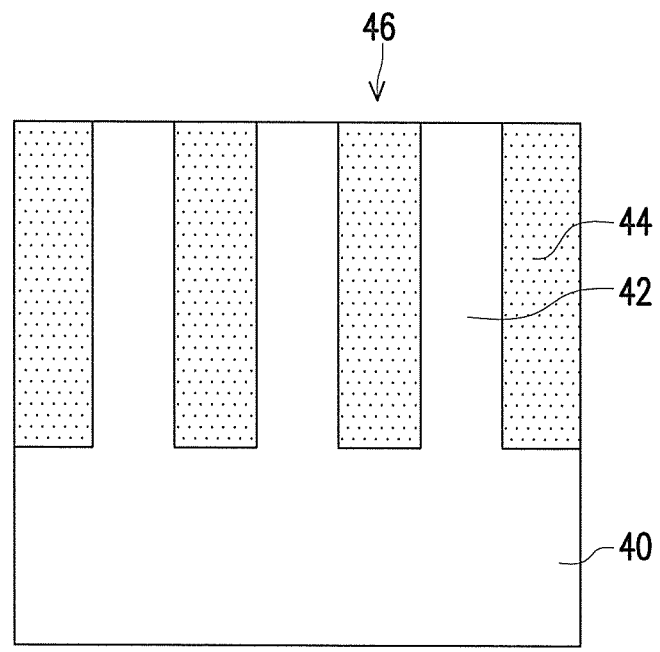
FIG. 4A to FIG. 4B illustrate schematic cross-sectional views of a removing process used in a FinFET STI etching back process according to an embodiment of the present invention.
Figure 4B:
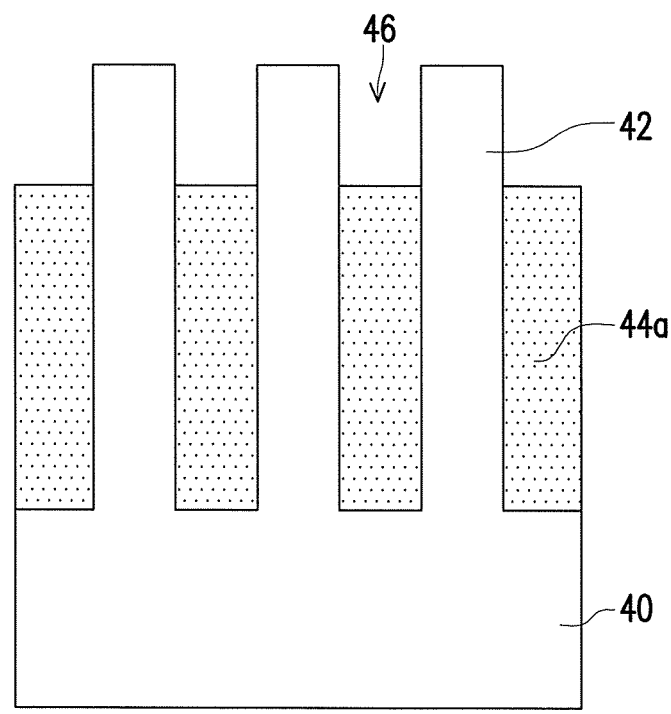

FIG. 4A to FIG. 4B illustrate schematic cross-sectional views of a removing process used in a FinFET STI etching back process according to an embodiment of the present invention.

Referring to FIG. 4A, in another embodiment, the removing process can be a FinFET STI etching back process. The material layer 11 (see FIG. 2A) can be an insulating layer 44 (see FIG. 4A) of the STI formed between fins 42 on a substrate 40. The insulating layer 44 can be a silicon oxide layer. During the fabrication of a fin transistor, in order to expose a portion of the fins 42, an etching back process is necessarily performed to remove a portion of the insulating layer 44. Since the gaps 46 between the fins 42 have a very small dimension (such as less than 50 nm), the formation of the by-produces is likely to hinder the removal of the insulating layer 44. With the method of the invention, the insulating layer 44 can be removed portion by portion by repeating the cycle process (step 110) many times. The by-products can be removed as much as possible by performing, after each etching process, the annealing process (step 116 in FIG. 1) and the optional purging process (step 118 in FIG. 1), thereby reducing the by-product residues within the gaps 46. Specifically, a portion of the undesired thickness of the insulating layer 44 is removed by performing one cycle process in step 110. The remaining portion of the undesired thickness of the insulating layer 44 is removed by performing another cycle process in step 110, and therefore an insulating layer 44a as STI remains and a portion of the fins 42 are exposed, as shown in FIG. 4B. Therefore, the ineffective etching of the insulating layer 44 caused by the by-product residues of the etching process can be avoided.

Figure 5A:
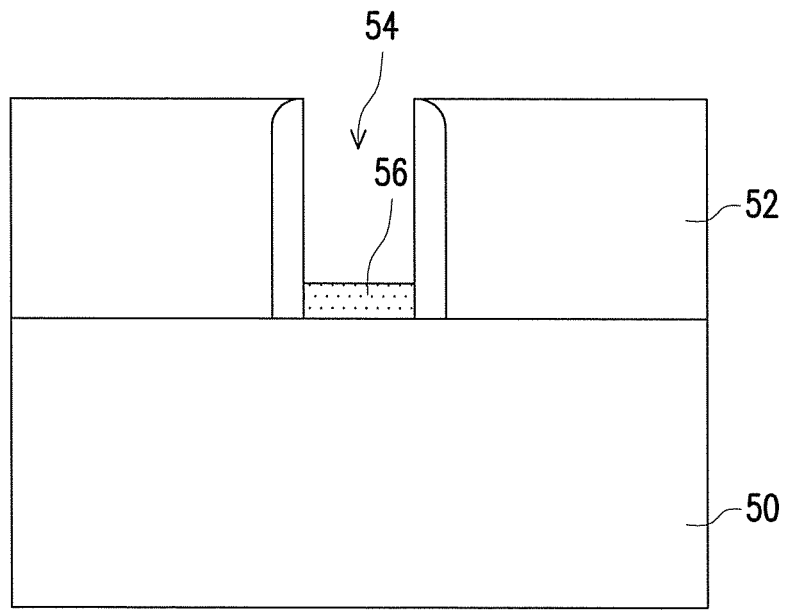
FIG. 5A to FIG. 5B illustrate schematic cross-sectional views of a removing process used in a replacement metal gate (RMG) process according to an embodiment of the present invention.
Figure 5B:
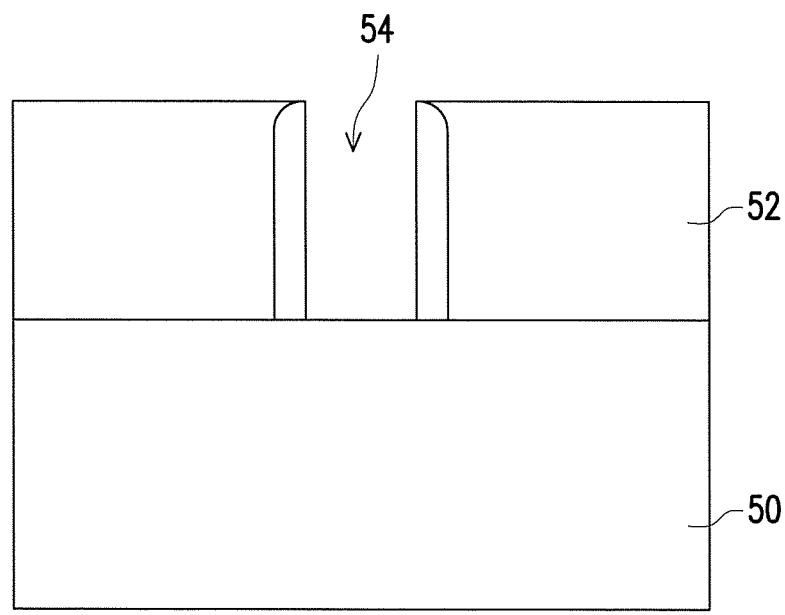

FIG. 5A to FIG. 5B illustrate schematic cross-sectional views of a removing process used in a replacement metal gate (RMG) process according to an embodiment of the present invention.

Referring to FIG. 5A and FIG. 2A, in yet another embodiment, the material layer 11 (see FIG. 2A) can be a dielectric layer 56 (see FIG. 5A) of the replacement metal gate (RMG) process. Referring to FIG. 5A, specifically, a substrate 50 has a dielectric layer 52 formed thereon. The dielectric layer 52 has a gate trench 54 formed therein. The dielectric layer 56 is formed on the bottom of the gate trench 54. The dielectric layer 52 can be a silicon oxide layer. The gate trench 54 has a very small dimension (such as less than 50 nm), and in such case, the dielectric layer 56 can be removed portion by portion by repeating the cycle process (step 110) many times. The by-products can be removed as much as possible by performing, after each etching process, the annealing process (step 116 in FIG. 1) and the optional purging process (step 118 in FIG. 1), thereby reducing the by-product residues within the gate trench 54. With the method of the invention, the dielectric layer 56 can be easily removed, as shown in FIG. 5B. Therefore, the incomplete etching of the dielectric layer 56 caused by the by-product residues of the etching process can be avoided.

Figure 6A:
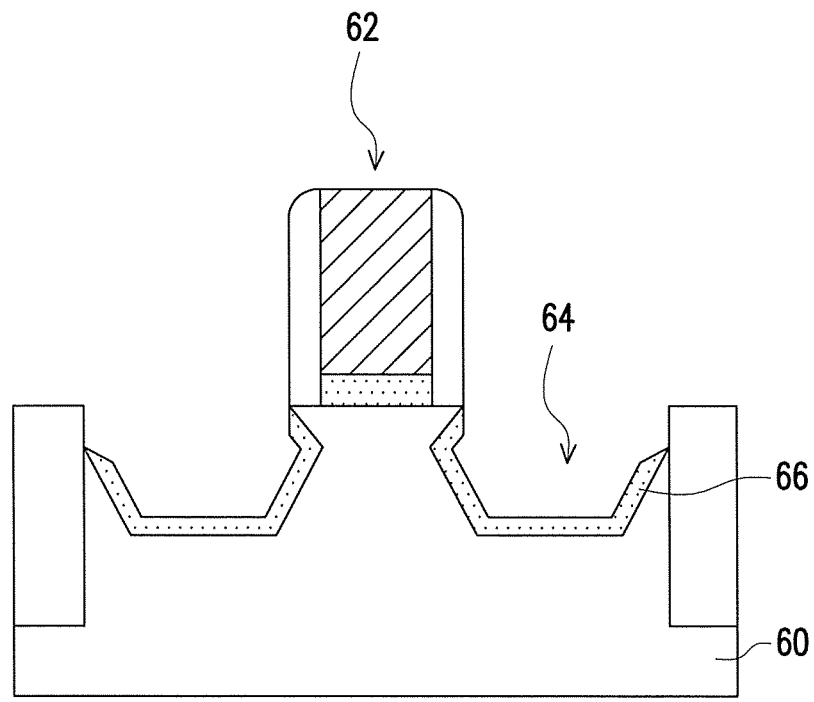
FIG. 6A to FIG. 6B illustrate schematic cross-sectional views of a removing process used in a pre-Epi clean process according to an embodiment of the present invention.
Figure 6B:
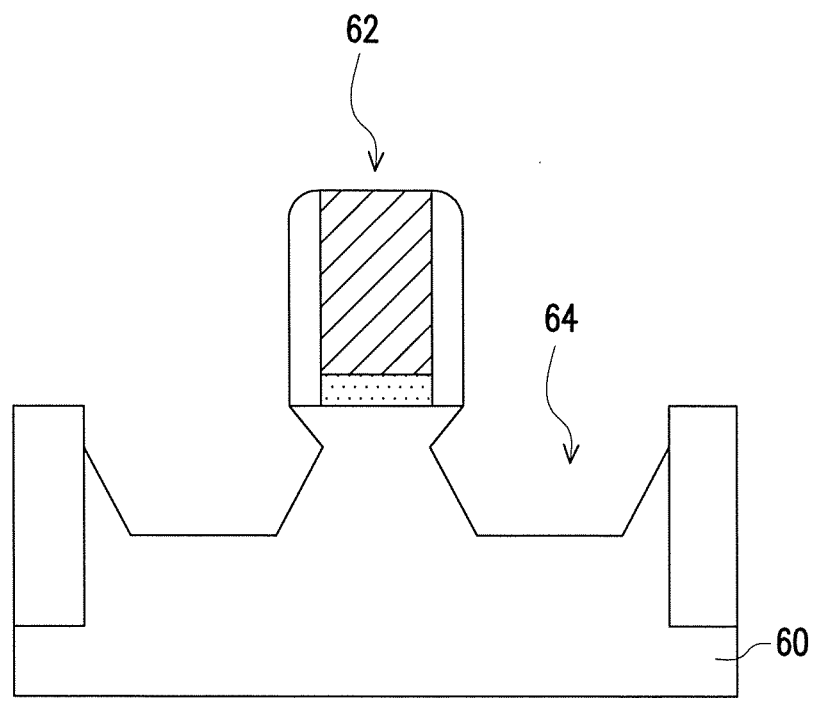

FIG. 6A to FIG. 6B illustrate schematic cross-sectional views of a removing process used in a pre-Epi clean process according to an embodiment of the present invention.

Referring to FIG. 6A, in still another embodiment, the removing process of the invention can be applied to a pre-Epi clean process. The substrate 60 has a gate structure 62 formed thereon. It is predetermined to form an epitaxial layer through an epitaxial process in the substrate 60 beside the gate structure 62. In an embodiment, the epitaxial layer includes a single crystalline silicon or a semiconductor compound. The semiconductor compound can be SiGe. Before the epitaxial process, recesses 64 have been formed in the substrate 60 beside the gate structure 62, and a silicon oxide layer 66 has been formed on surfaces of the recesses 64. The silicon oxide layer 66 can be a native silicon oxide layer. Generally, a cleaning (or called etching) process is necessarily performed before the epitaxial process, so as to remove the silicon oxide layer 66. The recesses 64 have a small dimension (such as less than 50 nm), so that the silicon oxide layer 66 on the surfaces of the recesses 64 are difficult to be removed or subjected to the etching loading effect. However, with the removing process of the invention, the loading effect can be reduced and the silicon oxide layer 66 can be effectively removed to expose the surfaces of the recesses 64, as shown in FIG. 6B.

In summary, in the removing process of the invention, a material layer is removed by performing a cycle process including an etching and an annealing multiple times, and optionally by performing a pre-annealing prior to the cycle process.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:
1. A removing method, comprising:
transferring a substrate into an etching machine, wherein the substrate has a material layer formed thereon;
performing a pre-annealing process before a cycle process, wherein a temperature of the pre-annealing process is from 150° C. to 190° C.;

performing the cycle process, comprising:
  performing an etching process to remove a portion of the material layer; and
  performing an annealing process to remove a by-product generated by the etching process;
repeating the cycle process at least one time; and
transferring the substrate out of the etching machine,
wherein an etching gas of the etching process comprises $NF_3$ and $NH_3$, and a volume flow rate ratio of $NF_3$ to $NH_3$ is greater than 1/10 and less than 1/2,
wherein a radio frequency of the etching process is from 10 kW to 40 kW.

2. The removing method of claim 1, wherein the cycle process is repeated at least two times.

3. The removing method of claim 1, wherein an etching rate of the etching process is from 0.5 angstrom/second to 1.5 angstrom/second.

4. The removing method of claim 1, wherein a gas introduced to the annealing process comprises $H_2$ and Ar.

5. The removing method of claim 1, wherein a temperature of the annealing process is from 150° C. to 500° C.

6. The removing method of claim 1, wherein the material layer is a silicon oxide layer.

7. The removing method of claim 6, wherein the silicon oxide layer is a native silicon oxide layer.

8. The removing method of claim 1, wherein the material layer is located on a fin.

9. The removing method of claim 1, wherein the material layer is a dielectric layer of a replacement metal gate (RMG) process.

10. The removing method of claim 1, wherein the removing process is a pre-Epi clean process.

11. The removing method of claim 1, wherein the removing process is a FinFET STI etching back process.

12. The removing method of claim 1, wherein the cycle process further comprises performing at least one purging process before the step of transferring the substrate out of the etching machine.

13. The removing method of claim 1, wherein the cycle process further comprises performing at least one purging process after the annealing process.

14. The removing method of claim 13, wherein a gas introduced to the at least one purging process comprises He.

15. The removing method of claim 13, wherein a time of the at least one purging process is 10 seconds to 60 seconds.

* * * * *